(12) United States Patent
Ma

(10) Patent No.: US 10,303,263 B2
(45) Date of Patent: May 28, 2019

(54) AUTO SWAP ORDER OF FINDING KEY TO GENERATE SCAN CODES

(71) Applicant: LENOVO (SINGAPORE) PTE. LTD., Singapore (SG)

(72) Inventor: Ke Ma, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 79 days.

(21) Appl. No.: 15/677,418

(22) Filed: Aug. 15, 2017

(65) Prior Publication Data

US 2019/0056795 A1    Feb. 21, 2019

(51) Int. Cl.
G06F 3/023    (2006.01)
G06F 3/02     (2006.01)

(52) U.S. Cl.
CPC .......... G06F 3/0238 (2013.01); G06F 3/0227 (2013.01)

(58) Field of Classification Search
CPC .............................. G06F 3/0238; G06F 3/0227
See application file for complete search history.

(56) References Cited

U.S. PATENT DOCUMENTS

| | | | | |
|---|---|---|---|---|
| 4,344,069 A * | 8/1982 | Prame | .................... | H03M 11/08 178/17 C |
| 6,650,317 B1 * | 11/2003 | Boone | .................... | G06F 3/1407 341/26 |
| 7,649,478 B1 * | 1/2010 | Yoon | ...................... | H03M 11/08 341/107 |
| 2004/0212596 A1 * | 10/2004 | Chen | ....................... | G06F 3/023 345/168 |
| 2007/0296709 A1 * | 12/2007 | GuangHai | ............. | G06F 3/0227 345/173 |
| 2008/0007434 A1 * | 1/2008 | Hristov | ................. | G06F 3/0237 341/22 |
| 2013/0215038 A1 * | 8/2013 | Senanayake | .......... | G06F 3/0488 345/169 |

FOREIGN PATENT DOCUMENTS

| | | | |
|---|---|---|---|
| JP | 63237118 A | 10/1988 | |
| JP | 02148319 A | 6/1990 | |
| JP | 06149437 A | 5/1994 | |

OTHER PUBLICATIONS

GB search report in application No. GB1812870.2 dated Jan. 31, 2019.

* cited by examiner

*Primary Examiner* — Dmitriy Bolotin

(74) *Attorney, Agent, or Firm* — Shimokaji IP

(57) ABSTRACT

A keyboard system includes a keyboard matrix; and an embedded controller in communication with the keyboard matrix, wherein the embedded controller is configured to: determine whether, in a single scan cycle of the keyboard matrix, multiple keys have been pressed or only a single key has been pressed; if only a single key has been pressed, learn an order of pressed keys in a plurality of scan cycles; and if multiple keys have been pressed, generate an order of the pressed multiple keys based on the learned order of pressed keys.

19 Claims, 7 Drawing Sheets

KEY6 IS IDENTIFIED IN ONE SCAN LOOP.
- SET ARRAY[6][1...n] AS "0"
- SET ARRAY[1...n][6] AS "1"

LATEST KEY: KEY 6

FIG. 3A

KEY4 IS IDENTIFIED IN THE NEXT SCAN LOOP.
- SET ARRAY[4][1...n] AS "0"
- SET ARRAY[1...n][4] AS "1"

LATEST KEY: KEY 4

FIG. 3B

KEY2 IS IDENTIFIED IN THE NEXT SCAN LOOP.
- SET ARRAY[2][1...n] AS "0"
- SET ARRAY[1...n][2] AS "1"

LATEST KEY: KEY 2

FIG. 3C

|   | 0 | 1 | 2 | 3 | 4 | 5 | 6 | n |
|---|---|---|---|---|---|---|---|---|
| 0 | -1 |   |   |   | 0 | 0 |   | -1 |
| 1 |   | -1 |   |   |   |   |   |   |
| 2 |   | 0 | 0 | -1 | 0 | 0 | 0 |   |
| 3 |   |   | -1 |   |   |   |   |   |
| 4 | 0 |   | 1 | 0 | -1 | 0 | -1 |   |
| 5 |   |   |   |   | 1 | -1 |   |   |
| 6 | 0 |   | 0 |   | 1 | 0 | -1 |   |
| n |   |   |   |   |   |   |   |   |

ANYTIME KEY4 AND KEY2 ARE IDENTIFIED IN THE SAME SCAN LOOP,
CALCULATE THE SUM OF ARRAY[4][1...n]:
$$\sum_{j=1}^{n} ARRAY[4][j] = 0 + 0 + 1 + 0 + (-1) + 0 + 0 + 0 = 0;$$
CALCULATE THE SUM OF ARRAY[2][1...n]:
$$\sum_{j=1}^{n} ARRAY[2][j] = 0 + 0 + 0 + (-1) + 0 + 0 + 0 + 0 = -1;$$
AS $\sum_{j=1}^{n} ARRAY[4][j] > \sum_{j=1}^{n} ARRAY[2][j]$ DETERMINE KEY4 SHOULD BE IN FRONT OF KEY2. SEND SCAN CODE IN ORDER OF [KEY4, KEY2].

FIG. 4A

|   | 0 | 1 | 2 | 3 | 4 | 5 | 6 | n |
|---|---|---|---|---|---|---|---|---|
| 0 | -1 | 1 | 0 | 1 | 0 | 1 | 0 | -1 |
| 1 | 1 | -1 | 1 | 1 | 1 | 1 | 1 |   |
| 2 | 0 | 1 | 0 | 0 | 1 | 0 | 1 |   |
| 3 | 1 | 1 | 0 | -1 | 1 | 1 | 1 |   |
| 4 | 0 | 1 | 1 | 1 | -1 | 1 | -1 |   |
| 5 | 1 | 1 | 0 | 1 | 1 | -1 | 1 |   |
| 6 | 0 | 1 | 1 | 1 | 0 | 1 | -1 |   |
| n |   |   |   |   |   |   |   |   |

IT IS ALSO POSSIBLE TO DETERMINE THE ORDER BY ONLY SIMPLY
CHECKING THE VALUE OF ARRAY[4][2] OR ARRAY[2][4]

AS ARRAY[4][2] = 1, DETERMINE KEY4 SHOULD BE IN FRONT OF KEY2.
OR
AS ARRAY[2][4] = 0, DETERMINE KEY2 SHOULD BE IN REAR OF KEY4.

FIG. 4B

ANYTIME KEY4, KEY2, KEY6 ARE IDENTIFIED IN THE SAME SCAN LOOP,

CALCULATE THE SUM OF ARRAY[4][1 ...n]:

$\sum_{j=1}^{n}$ ARRAY[4][j] = 0 + 0 + 1 + 0 + (-1) + 0 + 0 + 0 = 0;

CALCULATE THE SUM OF ARRAY[2][1 ...n]:

$\sum_{j=1}^{n}$ ARRAY[2][j] = 0 + 0 + (-1) + 0 + 0 + 0 + 0 + 0 = -1;

CALCULATE THE SUM OF ARRAY[6][1 ...n]:

$\sum_{j=1}^{n}$ ARRAY[6][j] = 0 + 0 + 1 + 0 + 1 + 0 + (-1) + 0 = 1;

AS $\sum_{j=1}^{n}$ ARRAY[6][j] > $\sum_{j=1}^{n}$ ARRAY[4][j] > $\sum_{j=1}^{n}$ ARRAY[2][j]

DETERMINE THE INPUT ORDER SHOULD BE KEY6, KEY4, KEY2. SEND SCAN CODE IN ORDER OF [KEY6, KEY4, KEY2].

FIG. 5

AUTO SWAP ORDER OF FINDING KEY TO GENERATE SCAN CODES

BACKGROUND OF THE INVENTION

The present invention generally relates to keyboards and, more particularly, to apparatus and methods of ordering the sending of scan codes in keyboards.

Computer keyboards—such as for laptops, notebooks, desktops, mobile phones—may include control circuitry to convert key presses into scan codes. A scan code is data that computer keyboards send to a computer to report which key has been pressed. A number, or sequence of numbers, is assigned to each key on the keyboard. Key switches are connected via a printed circuit board in an electrical X-Y matrix where a voltage is provided sequentially to the Y lines and, when a key is depressed, detected sequentially by scanning the X lines, or vice versa.

In most typing, only one key is pressed at a time and then released before the next key is pressed. However, in some instances, multiple keys may be pressed simultaneously or very quickly in sequence. This often occurs, for example, in gaming.

FIG. 1A depicts a conventional keyboard matrix 10. Drive or input lines are the columns, while detection or sense lines are the rows. Matrix scanning can start from A1 and proceed to G7, or vice versa, but not both. During use, for example, keys C4 and F5 may be pressed simultaneously or very quickly in sequence. Upon receipt of key pressing signals from the matrix 10, a keyboard integrated circuit 11 (i.e., embedded controller (EC)) can send scan codes, in a particular order, to the central processing unit 12.

In FIG. 1A, if the matrix scanning starts from A1 and proceeds to G7, the scan codes will be sent in the order of C4, F5. On the other hand, if the matrix scanning starts from G7 and proceeds to A1, the scan codes will be sent in the order of F5, C4. Whichever the scanning direction, the direction is fixed. Thus, the order of sending the scan codes is fixed. But this fixed order may be an incorrect order for a given circumstance. In other words, as an example, the keys may have been pressed in the order of C4, F5, but due to the scanning direction, the scan codes may be sent in the order of F5, C4.

FIG. 1B depicts another potential problem in the keyboard matrix 10 when two or more keys in the same drive line are pressed, during a single scan cycle, sequentially. A scan cycle is a period during which each drive line is scanned once in sequence. Accordingly, for example, a scanning cycle may start at drive line 1 and end at drive line 7. As a further example, it may take 0.5 milliseconds to scan each drive line.

Thus, in FIG. 1B, during an exemplary use of keyboard matrix 10, drive line 1 is scanned from A to G, and then 0.5 milliseconds later, drive line 2 is scanned from A to G, and so on. If, for example, during the scan of drive line 7, C6 is pressed. When drive lines 1-4 are scanned after drive line 7, 2.0 milliseconds have passed since drive line 7 was scanned. During the scan of drive line 5, for example, D6 is pressed, in the single scan cycle that started at drive line 7. When drive line 6 is scanned, the matrix 10 determines that C6 and D6 have been pressed. But because the keys were pressed during the same scan cycle and in the same drive line, the matrix 10 cannot discern whether C6 or D6 was pressed first. Accordingly, the scan codes may be sent incorrectly as D6, C6 rather than C6, D6. This results from having a fixed order of sending scan codes.

As can be seen, there is a need for improved apparatus and methods to order the sending of scan codes in keyboards.

SUMMARY OF THE INVENTION

In one aspect of the present invention, a keyboard system comprises a keyboard matrix; and an embedded controller in communication with the keyboard matrix, wherein the embedded controller is configured to: determine whether, in a single scan cycle of the keyboard matrix, multiple keys have been pressed or only a single key has been pressed; if only a single key has been pressed, learn an order of single pressed keys in a plurality of scan cycles; and if multiple keys have been pressed, generate an order of the pressed multiple keys based on the learned order of single pressed keys.

In another aspect of the present invention, an embedded controller in a keyboard system having a keyboard matrix, wherein the embedded controller is configured to: for each of a plurality of scan cycles of the keyboard matrix, determine whether only a single key is pressed; for each determined single key pressed, create a respective array in a two-dimensional array, wherein each respective array is created according to: [Latest_key][1 . . . n]; [1 . . . n][Latest_key]; [Latest_key][Latest_key]; wherein Latest-Key is the single key pressed in a given scan cycle and n is a number of columns and a number of rows in the two-dimensional array; for each of the plurality of scan cycles of the keyboard matrix, determine whether M number of multiple keys is pressed during one of the scan cycles; for each key_m pressed of the multiple keys, calculate a sum of an array [key_m][1 . . . M]; arrange all SUM key_m in a sum numerical order; and send scan codes for each of the key_m pressed during the single scan code in a sending order according to the sum numerical order.

In a further aspect of the present invention, a method of sending scan codes in a keyboard system having a keyboard matrix comprises when only a single key is pressed during each of a plurality of scan cycles of the keyboard matrix, then for each single key pressed: set a first array of [Latest_key][1 . . . n] to a first numerical value; set a second array of [1 . . . n][Latest_key] to a second numerical value; and set a third array of [Latest_key][Latest_key] to a third numerical value; wherein the Latest_key is the single key pressed in a given scan cycle; wherein n is a number of columns in a created array; and when multiple keys are pressed in a single scan cycle, then for each key_m pressed, wherein M is a total number of key_m pressed: calculate a sum of an array [key_m][1 . . . M]; arrange the sums of the arrays in a numerical descending order; send scan codes for each key_m in the numerical descending order.

These and other features, aspects and advantages of the present invention will become better understood with reference to the following drawings, description and claims.

BRIEF DESCRIPTION OF THE DRAWINGS

FIGS. 3A-3C is a learning sequence of key arrays in accordance with an exemplary embodiment of the present invention;

FIGS. 4A-4B are key arrays, after learning, when multiple keys are pressed simultaneously in accordance with an exemplary embodiment of the present invention;

FIG. 5 is a flow chart of a method in accordance with another exemplary embodiment of the present invention;

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features. However, any single inventive feature may not address any of the problems discussed above or may only address one of the problems discussed above. Further, one or more of the problems discussed above may not be fully addressed by any of the features described below.

Broadly, the present invention provides apparatus and methods for ordering the sending of scan codes in a keyboard system, particularly when multiple keys are pressed simultaneously or are pressed quickly in succession. In the present invention, the ordering is not fixed. Instead, the present invention learns an order of scan codes when single keys are pressed in succession, with one key pressed per one scan cycle. Any number of keys may be the subject of a learned order. Later, when those single keys are pressed simultaneously or very quickly in succession, the present invention sends scan codes based on the learned order.

In the present invention, the learned order represents an order of how a specific user presses a group of keys. Thereby, when a specific user presses the group of keys, scan codes will be sent in an order that better matches the order expected by the specific user. Accordingly, in the present invention, the learned order for a group of keys may change from user to user. Also, the learned order may change over time and therefore a scan code order for any given set of keys may change over time.

Figure 1A:
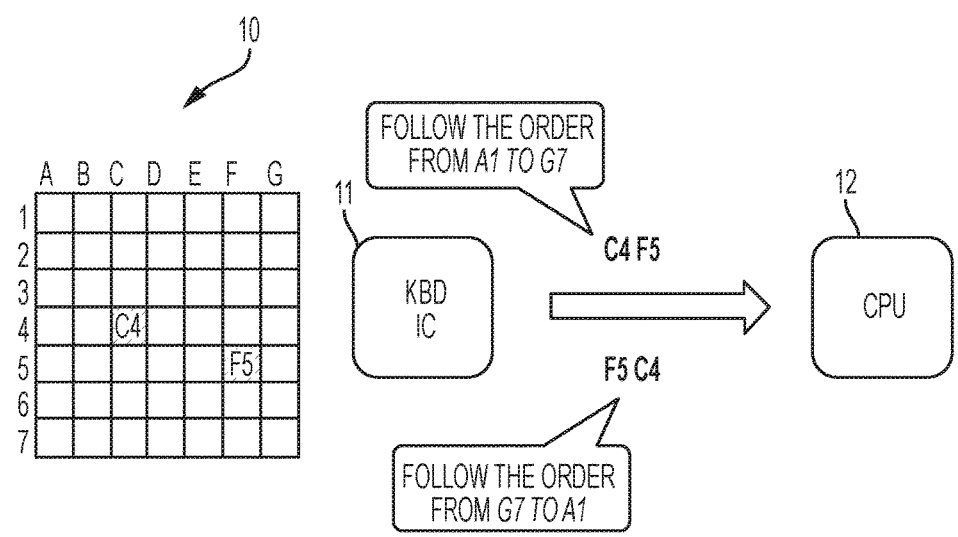
FIG. 1A is a schematic diagram of a keyboard system according to the prior art.
Figure 1B:
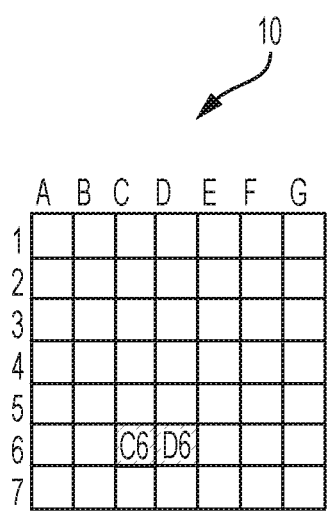
FIG. 1B is a schematic diagram of keyboard matrix according to the prior art.
Figure 2:
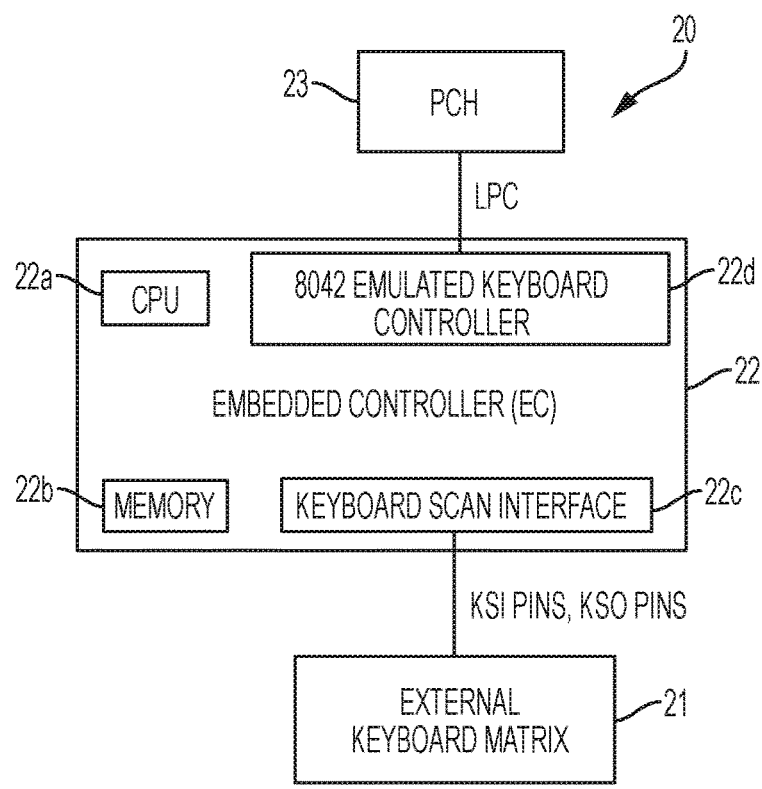
FIG. 2 is a schematic diagram of a keyboard system in accordance with an exemplary embodiment of the present invention.

FIG. 2 is a schematic block diagram of a keyboard system 20 according to an embodiment of the present invention. The system 20 may include a keyboard matrix 21 similar to the general construction of the matrix 10 shown in FIGS. 1A-1B. An embedded controller (EC) 22 may include a CPU 22a and a memory 22b. The EC 22 may further include a keyboard scan interface 22c that can communicate, via key scan input (KSI) and key scan output (KSO) pins, with the keyboard matrix 21.

Thereby, the EC 22 is enabled to poll or scan the drive lines and sense lines in the matrix 21 and to thus identify which key is being pressed. When multiple keys are pressed in the same scan cycle, the EC 22 can determine the order of sending scan codes, as described below. A conventional 8042 emulated keyboard controller 22d may emulate 8042 behavior, as known in the art, to send the ordered scan codes, via a low pin count (LPC) bus, to a conventional platform controller hub (PCH) 23 and eventual display.

In FIGS. 3A-3C, according to an exemplary embodiment, the embedded controller 22 may be configured to learn an order of singly pressed keys in a group/set of pressed keys. FIGS. 3A-3C depict three keys that are learned to have a particular order.

In FIG. 3A, as an example, in one scan cycle, only one key, such as key 6, is pressed. The pressing of key 6 is depicted, in a created two-dimensional key array, by the use of three arrays. The two-dimensional array may have n number of columns and n number of rows. One array is [6][1 . . . n] and is set to "0". Another array is [1 . . . n][6] and is set to "1". A third array is null or reserved and is set to "−1" array. A Latest_Key is then set to key 6.

In FIG. 3B, as an example, in a next successive scan cycle, only one key, such as key 4, is pressed. The pressing of key 4 is depicted, in the two-dimensional key array, by the use of three arrays. One array is [4][1 . . . n] and is set to "0". Another array is [1 . . . n][4] and is set to "1". The third array is null or reserved and is set to "−1". A Latest_Key is then set to key 4.

In FIG. 3C, as an example, in a next successive scan cycle, only one key, such as key 2, is pressed. The pressing of key 2 is depicted, in the two-dimensional key array, by the use of two arrays. One array is set as [2][1 . . . n]=0. Another array is set as [1 . . . n][2]=1. The "−1" in the array remains as null or reserved. A Latest_key is then set to key 2.

Although the foregoing example depicts a different, single key pressed for each scan cycle, the present invention contemplates that one or more single keys can be the same in the different scan cycles. Further, although the respective arrays for the three keys are set to the numerical values of 1, 0 and −1, other numerical can be used.

FIGS. 4A and 4B represent exemplary situations where two and three of the three learned keys, from FIGS. 3A-3B, are pressed simultaneously.

In FIG. 4A, as an example, two keys—key 4 and key 2—are pressed in the same scan cycle.

For key 4, a sum of the array [4][1 . . . n] is calculated:

$$\sum_{i=1}^{n} \text{Array}[4][i] = 0 + 0 + 1 + 0 + (-1) + 0 + 0 + 0 = 0$$

For key 2, a sum of the array [2][1 . . . n] is calculated:

$$\sum_{i=1}^{n} \text{Array}[2][i] = 0 + 0 + (-1) + 0 + 0 + 0 + 0 + 0 = -1$$

Since the sum of the array [4][1 . . . n] is greater than the sum of the array [2][1 . . . n], it is determined that the order of the keys should be key 4, key 2 (and not key 2, key 4). Thus, the scan codes can be sent in the order of key 4, key 2.

Alternatively, the scan code order can be determined by checking the value of array [4][2] and the value of array [2][4]. The value of array [4][2] is 1; therefore, it can be determined that key 4 should precede key 2. The value of array [2][4] is 0; therefore, it can be determined that key 2 should follow key 4.

In FIG. 5, as an example, three keys—key 4, key 2, and key 6—are pressed in the same scan cycle.

For key 4, a sum of the array [4][1 . . . n] is calculated:

$$\sum_{i=1}^{n} \text{Array}[4][i] = 0 + 0 + 1 + 0 + (-1) + 0 + 0 + 0 = 0$$

For key 2, a sum of the array [2][1 ... n] is calculated:

$$\sum_{i=1}^{n} \text{Array}[2][i] = 0 + 0 + (-1) + 0 + 0 + 0 + 0 + 0 = -1$$

For key 6, a sum of the array [6][1 ... n] is calculated:

$$\sum_{i=1}^{n} \text{Array}[6][i] = 0 + 0 + 1 + 0 + 1 + 0 + (-1) + 0 = 1$$

Since the sum of the array [6][1 ... n] is greater than the sum of the array [4][1 ... n], which is greater than the sum of the array [2][1 ... n], it is determined that the order of the keys should be key 6, key 4, key 2 (and not key 2, key 4, key 6, as an example). Thus, the scan codes can be sent in the order of key 6, key 4, key 2.

Although the foregoing example depicts that the learned single keys are the same as the pressed multiple keys, the present invention contemplates that the pressed multiple keys are generally among the learned single, pressed keys. Accordingly, for example, the learned keys may include a total of 4 keys, while the multiple pressed keys may only include 3 of the 4 learned keys.

Although the foregoing example depicts the sums of the arrays being arrange in descending order, the present invention contemplates that the sums of the arrays can be arranged in ascending order.

As appreciated from the foregoing, the keyboard system 20 and, in particular, the embedded controller 22 may be configured to perform steps of a method of learning and, based on that learning, determining an order of sending scan codes when multiple keys are pressed during a single scan cycle.

Figure 6:
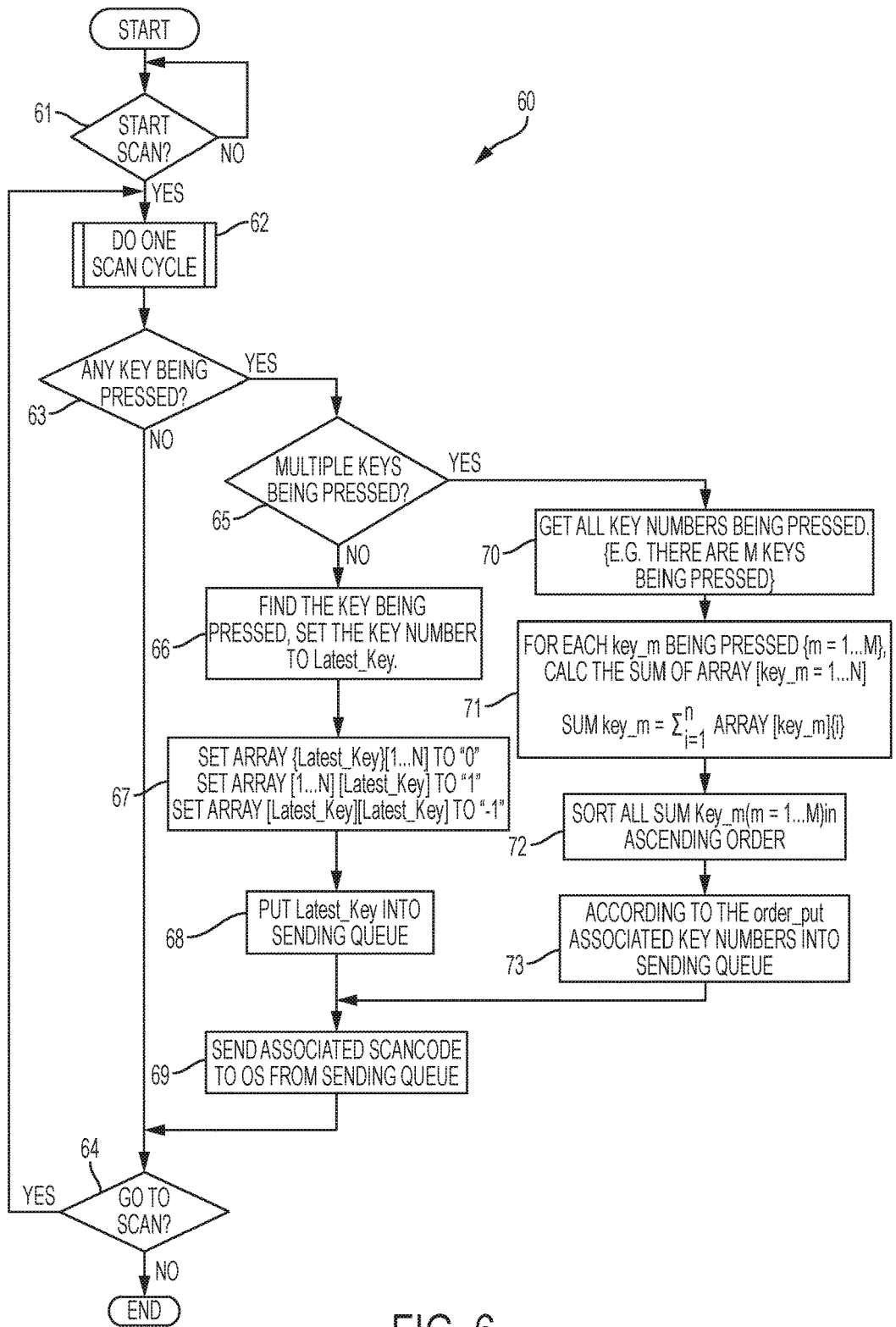
FIG. 6 is a flow chart of an exemplary method of the present invention.

FIG. 6 is a flowchart of an exemplary method 60 according to the present invention. In an embodiment, the method 60 generalizes the specific examples depicted in FIGS. 3A-3C, 4A-4B, and 5.

In a step 61, it may be determined whether a scan of a keyboard matrix is to start. If "no", then the method 60 may loop back to step 61. If "yes", then a step 62 may initiate a single scan cycle.

In a step 63, it may be determined whether at least one key has been pressed. If "no, then the method 60 may proceed to a step 64. If "yes", the method may proceed to a step 65.

In the step 64, it may be determined whether a next scan cycle is to proceed. If "yes", the method 60 returns to the step 62. If "no", the method 60 ends.

In the step 65, it may be determined whether multiple keys (i.e., a group of keys) have been pressed in the single scan cycle. If "no", the method 60 may proceed through a series of steps (66-68) for learning an order of single, pressed keys (or scan codes) in a plurality of scan cycles, with only one key per single scan cycle. If "yes", the method 60 may proceed through a series of steps (70-73) to generate an order of simultaneously pressed (or quickly successively pressed) keys (or scan codes) in the single scan cycle, which generated order is based on the learned order of single, pressed keys in a plurality of scan cycles.

In the learning steps, the step 66 may determine which single key is being pressed in the single scan cycle, and then set the determined key to "Latest_Key".

In the step 67 of the learning steps, a respective array in a two-dimensional array may be created for each singly pressed key in the plurality of scan cycles. Each respective array may be set to a numerical value. Accordingly, a first array, in a created two-dimensional array, may be created as [Latest_Key][1 ... n] and each entry in that array can be set to "0". A second array, in the two-dimensional array, may be created as [1 ... n][Latest_Key] and each entry in that array can be set to "1". A third array, in the two-dimensional array, may be created as [Latest_Key][Latest_Key] and each entry in that array can be set to "−1".

As described above, a single scan cycle may scan n number of keys, the two-dimensional array may have n number of rows and n number of columns.

In the step 68 of the learning steps, the Latest_Key may be placed in a sending queue of the EC 22 for eventual transmission of a scan code for the Latest_Key in a step 69.

In the scan code order generating steps, the step 70 may determine all keys that have been pressed during the single scan cycle, wherein there are M number of keys.

In the step 71, for each key_m pressed, wherein m=1 ... M, in the two-dimensional array, a sum of an array [key_m][1 ... M] can be calculated according to:

$$\text{SUM key}\_m = \sum_{i=1}^{n} \text{Array}[\text{key}_m][i]$$

In the step 72, all SUM key_m (m=1 ... M) may be arranged in sum descending order.

In the step 73, key numbers are sent in a generated order, to the sending queue of the EC 22, according to the sum descending order, for eventual transmission of the scan codes in the step 69. Accordingly, the SUM key_m having the highest numerical value enables an associated scan code to be sent first. And, the SUM key_m having the lowest numerical value enables an associated scan code to be sent last. However, the present invention contemplates that the order can be reversed.

As can be appreciated, as the method 60 continues to cycle through its steps, the method 60 continually learns orders of different groups of single keys. The method 60 also learns to change to order of the same group of single keys as the user changes the order of those single keys. Therefore, the generated order of groups of keys pressed during a single scan cycle can change over time.

It should be understood, of course, that the foregoing relates to exemplary embodiments of the invention and that modifications may be made without departing from the spirit and scope of the invention as set forth in the following claims.

I claim:

1. A keyboard system, comprising:
   a keyboard matrix; and
   an embedded controller in communication with the keyboard matrix, wherein the embedded controller is configured to:
     determine whether, in a single scan cycle of the keyboard matrix, multiple keys have been pressed or only a single key has been pressed;
     if only a single key has been pressed, learn an order of single pressed keys in a plurality of scan cycles; and
     if multiple keys have been pressed, generate an order of the pressed multiple keys based on the learned order of single pressed keys.

2. The system of claim 1, further comprising a platform controller hub in communication with the embedded controller.

3. The system of claim 1, wherein the embedded controller includes a keyboard scan interface in communication with the keyboard matrix.

4. The system of claim 1, wherein the embedded controller includes an 8042 emulated keyboard controller.

5. The system of claim 1, wherein the embedded controller is further configured to:
  create, for each single key pressed in the plurality of scan cycles, a respective array in a two-dimensional array.

6. The system of claim 5, wherein each respective array is set to a numerical value.

7. The system of claim 1, wherein the pressed multiple keys in the single scan cycle are among the single, pressed keys in the plurality of scan cycles.

8. An embedded controller in a keyboard system having a keyboard matrix, wherein the embedded controller is configured to:
  for each of a plurality of scan cycles of the keyboard matrix, determine whether only a single key is pressed;
  for each determined single key pressed, create a respective array in a two-dimensional array, wherein each respective array is created according to:
  [Latest_key][1 . . . n];
  [1 . . . n][Latest_key];
  [Latest_key][Latest_key];
    wherein Latest-Key is the single key pressed in a given scan cycle and n is a number of columns and a number of rows in the two-dimensional array;
  for each of the plurality of scan cycles of the keyboard matrix, determine whether M number of multiple keys is pressed during one of the scan cycles;
  for each key_m pressed of the multiple keys, calculate a sum of an array [key_m][1 . . . M] according to:

SUM key_$m = \Sigma_{i=1}^{n}$Array[key_$m$][$i$];

arrange all SUM key_m in a sum numerical order; and
  send scan codes for each of the key_m pressed during the single scan code in a sending order according to the sum numerical order.

9. The controller of claim 8, further configured to assign a numerical value of −1, 0, or 1 to each respective array of the determined single keys pressed.

10. The controller of claim 8, wherein the number of columns is the same as the number of rows in the two-dimensional array.

11. The controller of claim 8, wherein each key_m pressed is a determined single key pressed.

12. The controller of claim 8, wherein the SUM key_m having the highest numerical value enables an associated scan code to be sent first.

13. The controller of claim 8, wherein the SUM key_m having the lowest numerical value enables an associated scan code to be sent last.

14. A method of sending scan codes in a keyboard system having a keyboard matrix, comprising:
  when only a single key is pressed during each of a plurality of scan cycles of the keyboard matrix, then for each single key pressed:
    set a first array of [Latest_key][1 . . . n] to a first numerical value;
    set a second array of [1 . . . n][Latest_key] to a second numerical value; and
    set a third array of [Latest_key][Latest_key] to a third numerical value;
    wherein the Latest_key is the single key pressed in a given scan cycle;
    wherein n is a number of columns in a created array; and
  when multiple keys are pressed in a single scan cycle, then for each key_m pressed, wherein M is a total number of key_m pressed:
    calculate a sum of an array [key_m][1 . . . M];
    arrange the sums of the arrays in a numerical descending order;
    send scan codes for each key_m in the numerical descending order.

15. The method of claim 14, wherein the first, second, and third numerical values are each different from one another.

16. The method of claim 15, wherein the first numerical value is 0, the second numerical value is 1, and the third numerical value is −1.

17. The method of claim 14, wherein the first, second, and third arrays are in a single two-dimensional array.

18. The method of claim 17, wherein, in the two-dimensional array, a number of rows is equal to the number of columns.

19. The method of claim 14, wherein each of the plurality of scan cycles occurs in a same order of drive lines.

* * * * *